United States Patent
Beyer et al.

[11] Patent Number: 5,098,856
[45] Date of Patent: Mar. 24, 1992

[54] AIR-FILLED ISOLATION TRENCH WITH CHEMICALLY VAPOR DEPOSITED SILICON DIOXIDE CAP

[75] Inventors: Klaus D. Beyer, Poughkeepsie; Louis L. Hsu; Subodh K. Kulkarni, both of Fishkill, all of N.Y.

[73] Assignee: International Business Machines Corporation, Armonk, N.Y.

[21] Appl. No.: 717,267

[22] Filed: Jun. 18, 1991

[51] Int. Cl.$^5$ ............................................. H01L 21/76
[52] U.S. Cl. ........................................ 437/65; 437/927
[58] Field of Search .................. 437/64, 65, 927, 228

[56] References Cited

U.S. PATENT DOCUMENTS

| | | | |
|---|---|---|---|
| 3,689,992 | 9/1972 | Schutze et al. | 437/65 |
| 3,932,226 | 1/1976 | Klatskin et al. | 437/927 |
| 4,925,805 | 5/1990 | Van Omner et al. | 437/65 |

Primary Examiner—Olik Chaudhuri
Assistant Examiner—G. Fourson
Attorney, Agent, or Firm—Whitham & Marhoefer

[57] ABSTRACT

A process for forming air-filled isolation trenches in a semiconductor substrate by a conformal chemical vapor deposition (CVD) of a silicon dioxide layer over the passivated surface of the semiconductor substrate in which intersecting trenches have been formed and partially filled with a material that can subsequentially be removed from under the CVD silicon dioxide layer, such materials include water soluble glasses and polymeric materials, such as a polyimide. The CVD silicon dioxide is etched back to the passivated surface of the semiconductor substrate, forming openings in the layer at the trench intersections that extend to the trench fill material. The fill material is removed through these openings. A CVD silicon dioxide layer is deposited to fill the openings, leaving a silicon dioxide cap bridging the air-filled trench. Water soluble glasses that may be used to fill the trench include BSG glass ($B_2O_3$ content greater than 55%) and germanosilicate glass ($GeO_2$ content greater than 50%). A polymer fill, such as a polyimide, if used, may be removed by plasma etching in $O_2$.

17 Claims, 3 Drawing Sheets

5,098,856

AIR-FILLED ISOLATION TRENCH WITH CHEMICALLY VAPOR DEPOSITED SILICON DIOXIDE CAP

BACKGROUND OF THE INVENTION

1. Field of the Invention

The present invention generally relates to a method for forming dielectric isolation regions in a semiconductor substrate, and more particularly to an improved method for forming an air-filled isolation trench in a silicon substrate.

2. Description of the Prior Art

So-called trenches are commonly used in the fabrication of semiconductor devices to isolate active regions of the semiconductor substrate. Usually, the isolating trench is filled with a dielectric material. Polysilicon, chemically vapor deposited (CVD) silicon dioxide, BSG glass, and polyimides are examples of prior art trench-fill materials. Each of these materials have a dielectric constant which is considerably larger than that of air. As will be appreciated by those skilled in the art, an air-filled trench would be advantageous in that it would minimize the parasitic coupling between devices isolated by the trench and reduce electrical leakage and mechanical stress as compared with trench-fill materials of the type described above.

Proposals have been made in the prior art for an air-filled isolation trench.

U.S. Pat. No. 4,169,000 discloses a method for forming a fully-enclosed air isolation structure which comprises etching a pattern of cavities extending from one surface of a silicon substrate into the substrate to laterally surround and electrically isolate the substrate pockets. Prior to etching a cavity pattern, a first layer of silicon dioxide is formed on the substrate surface. A planar layer of silicon dioxide is formed on a separate silicon substrate which is then placed over the first substrate to cover the openings. This latter planar layer of silicon dioxide is fused to the silicon dioxide in the substrate having patterns of cavities formed therein. The separate silicon substrate is removed leaving cavities fully enclosed by the silicon dioxide layer.

U.S. Pat. No. 4,356,211 discloses dielectric isolation trenches in a monocrystalline silicon substrate by reactive ion etching after having etched openings in a layered structure of silicon dioxide and silicon nitride on the surface of the substrate. The walls of the trenches in the substrate are oxidized prior to depositing polycrystalline silicon on the substantially vertical side walls of the trenches in the substrate and on the substantially vertical walls defining the openings in the layered structure. The top portion of the polycrystalline silicon on the substantially vertical walls of the openings in the layered structure is selectively doped so that the polycrystalline silicon on the top portion of the vertical walls of the openings in the layered structure will oxidize at least twice as fast as the polycrystalline silicon on lower part of the side walls of the trenches in the substrate. Thermal oxidation causes the polycrystalline silicon to close the upper end of each of the trenches while leaving an air space therebeneath to form the dielectric isolation regions.

U.S. Pat. No. 4,888,300 discloses a trench cut into an epitaxial layer to provide access to a differently doped buried layer. While suspending the portion of the epitaxial layer surrounded by the trench by means of an oxide bridge, the underlying region of the buried layer is etched away to form a cavity under the active area. This cavity, as well as the surrounding trench, is then filled with a suitable insulating material to isolate the active island from the substrate.

U.S. Pat. No. 4,916,513 discloses an integrated circuit structure which is made up of laterally-spaced islands separated from each other by closed annular grooves of an electrically isolating matter which can be either ambient air or vacuum, or an oxide formed from the adjacent semiconductor material.

Japanese patent number 60,147131 dated Mar. 8, 1985 discloses dielectric isolating grooves formed downward from the surface of an Si substrate. An $SiO_2$ film is formed in the groove by means of CVD.

SUMMARY OF THE INVENTION

An object of this invention is the provision of an improved method for forming an air-filled isolation trench in a semiconductor substrate; an air-filled isolation trench which has a silicon dioxide cap formed by chemical vapor deposition.

Briefly, this invention contemplates a process for forming air-filled isolation trenches in a semiconductor substrate by a conformal chemical vapor deposition (CVD) of a silicon dioxide layer over the passivated surface of the semiconductor substrate in which intersecting trenches have been formed and partially filled with a material that can subsequently be removed from under the CVD silicon dioxide layer, such materials include water soluble glasses and polymeric materials, such as a polyimide. The CVD silicon dioxide is etched back to the passivated surface of the semiconductor substrate, forming openings in the layer at the trench intersections that extend to the trench fill material. The fill material is removed through these openings. A CVD silicon dioxide layer is deposited to fill the openings, leaving a silicon dioxide cap bridging the air-filled trench. Water soluble glasses that may be used to fill the trench include BSG glass ($B_2O_3$ content greater than 55%) and germanosilicate glass ($GeO_2$ content greater than 50%). A polymer fill, such as a polyimide, if used, may be removed by plasma etching in $O_2$.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
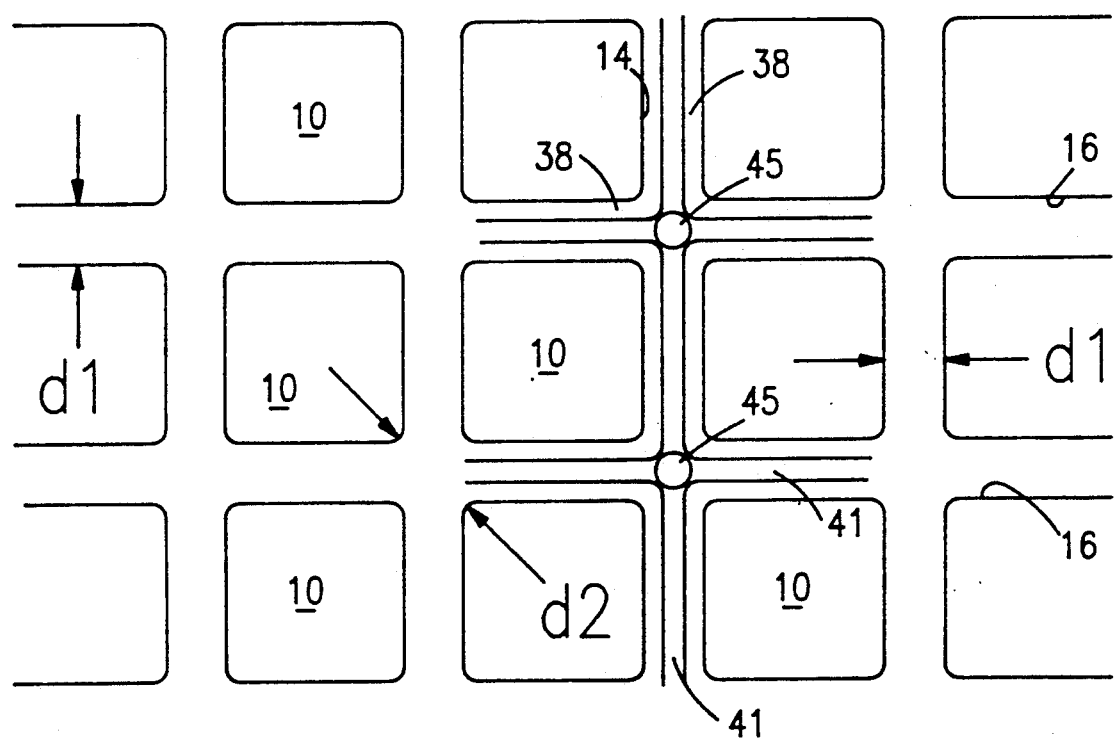
FIG. 1 is a plan view illustrating a typical trench pattern for a semiconductor substrate.

Referring now to FIG. 1 of the drawings, in a typical integrated circuit of the type to which the teachings of this invention are applicable, active semiconductor regions 10 are isolated by a grid of intersecting trenches; trenches 14 (vertically orientated in the Figure), and trenches 16 (horizontally orientated in the Figure).

Figure 2A:
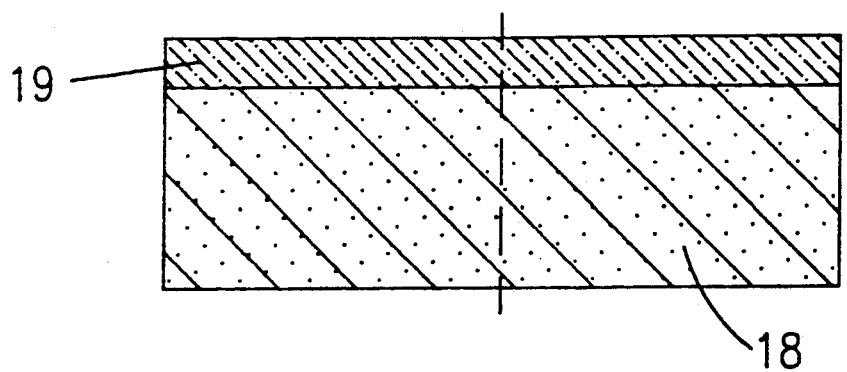
FIGS. 2A through 2H are partial sectional views illustrating various steps in the formation of silicon dioxide capped air-filled trench in accordance with the teachings of this invention.

Referring now to FIGS. 2A through 2H in addition to FIG. 1, FIG. 2A illustrates a sectional view of a silicon semiconductor wafer 18 with a passivated layer 19 (for example thermal oxide/silicon nitride/polysilicon) on its upper surface. The passivated layer can be formed by any suitable prior art techniques. For example the oxide may be formed by thermal oxidation and the silicon nitride by CVD through a thermal reaction of dichlorosilane ($SiCl_2H_2$) and ammonia ($NH_3$) at a temperature of about 800° C. and the polysilicon by pyrolysis of silane between 600° and 700° C.

After the passivated layer 19 is deposited, a mask is formed over the layer by depositing a photoresist and then exposing and developing the photoresist to produce the mask to enable etching of trenches 14 and 16 in a suitable manner well known in the art (see for example the aforementioned U.S. Pat. No. 4,356,211). The trenches 14 and 16 are preferably formed by reactive ion etching (RIE) in $SF_6/Cl_2$. This produces substantially vertical side walls in each of the trenches.

Figure 2B:
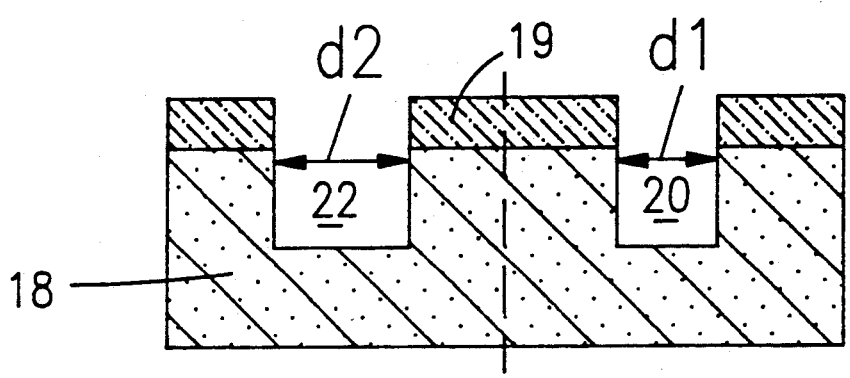

In this example, the trenches 14 and 16 are of the same width "d1". The sectional view of a trench on the right-hand side 20 of the views starting with FIG. 2B, represents a view directly across a trench 14 or 16 with a width "d1". The sectional view on the left-hand side labeled 22 represents a sectional view across the intersections of trenches 14 and 16, with a width "d2". The dotted line down the middle of the Figures is intended to indicate that the sectional view of the trenches does not lie in a single plane. In addition, for any trench pattern widened trenches are suitable, which are extended from "d1" to "d2" at certain locations and which are positioned 10 to 25 μm from each other.

The width "d2" is determined by the width of the intersecting trenches and the trench pattern corner rounding at the trench intersections. For a trench width of d1 = 1.5 μm, the trench width "d2" at trench intersection is approximately 3 μm, twice the trench width of "d1". If desired, trench widths of "d2" at the intersections greater than twice the trench width "d1" can be formed. This can be accomplished by increasing the spacing between trench corners on the mask, which widens the photoresist pattern at the trench corners.

Figure 2C:
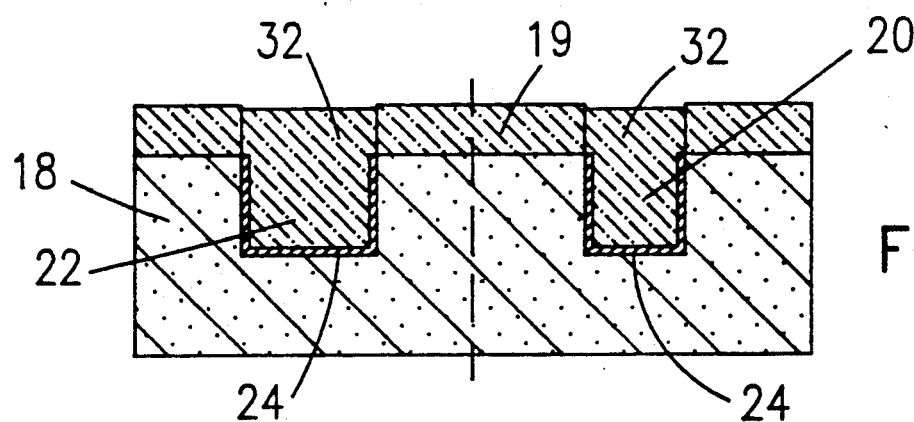

The substantially vertical walls and the substantially horizontal bottom wall of each of the trenches has a layer 24 of silicon dioxide formed thereon, as illustrated in FIG. 2C. The silicon dioxide layer 24 can be formed by thermal oxidation in steam at a temperature of 1050° C., for example. The thickness of the layer 24 of silicon dioxide is in a range of 100 nanometers to 500 nanometers and its purpose is to protect the trench walls.

As also illustrated in FIG. 2C, the trenches 20 and 22 are then filled with a material that can be removed through small openings in the CVD silicon dioxide cap to be formed. A water soluble glass 32, such as BSG with a $B_2O_3$ content greater than 55%, is a suitable fill material. The soluble glass fill 32 may be formed in the trench 20 by pyrolysis of triethoxyborate or trimethoxyborate between 400° C. and 500° C.

Figure 2D:
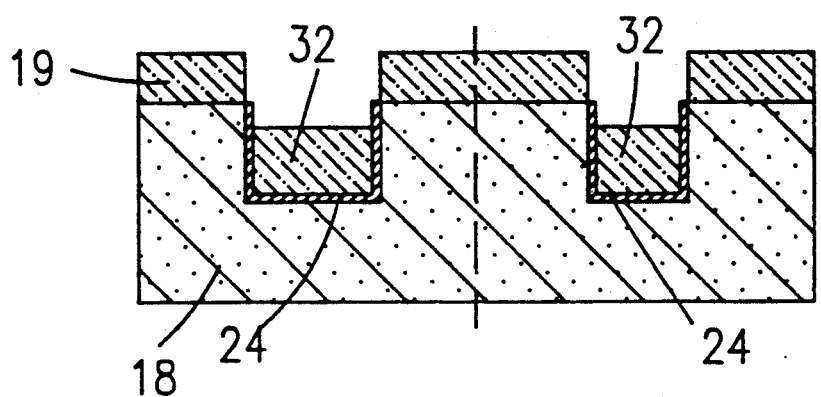
Figure 2E:
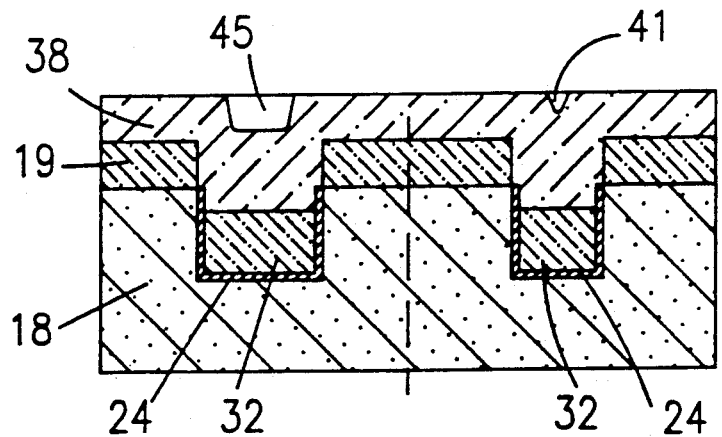

Referring now to FIG. 2D, the glass fill 32 is next etched back below the passivated surface of the semiconductor wafer 18, preferably by means of an RIE etch using the same tool as was used to etch the trenches 20 and 22 such as an AMP 5000 cluster tool, in order to prevent moisture access. In practice, a second BSG deposition and a second RIE etch may be used advantageously in order to provide a planar upper surface to the glass fill. Referring to FIG. 2E, a silicon dioxide ($SiO_2$) layer 38 is chemically vapor deposited after the formation of the recessed glass fill 32 in the trenches; this step is a conformal CVD deposition with a suitable thickness, for example approximately one-half of the trench width "d1". As the layer 38 builds, a slight depression 41 forms in the layer 38 over the trenches 14 and 16 (see FIG. 1). Where the trenches 14 and 16 intersect, an enlarged depressed region 45 forms owing to the conformal nature of the CVD deposition in this step and the increased width "d2" at the trench intersections.

Figure 2F:
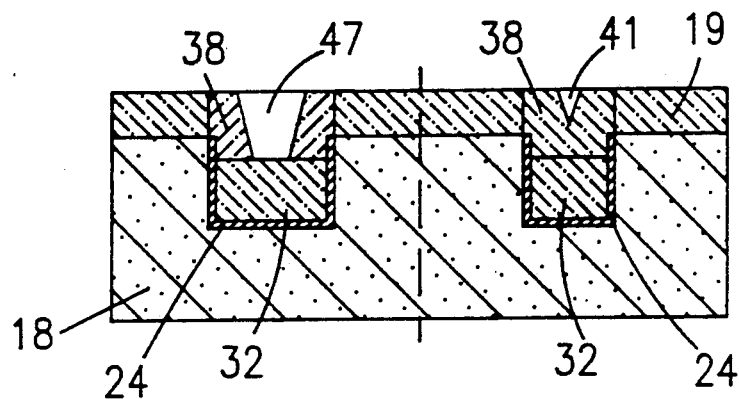

Next the CVD silicon dioxide layer 38 is etched back by means of a RIE etch end pointed at the upper surface of the passivated layer 19, which is a polysilicon layer. FIG. 2F illustrates this point in the process. Here it should be noted in etching the depressed regions 45 at the trench intersections, openings 47 in the silicon dioxide layer 38 are formed as the RIE etch removes the oxide layer. These openings 47 extend to the upper surface of the water soluble glass fill 32 and are self aligned with the trench intersections.

Figure 2G:
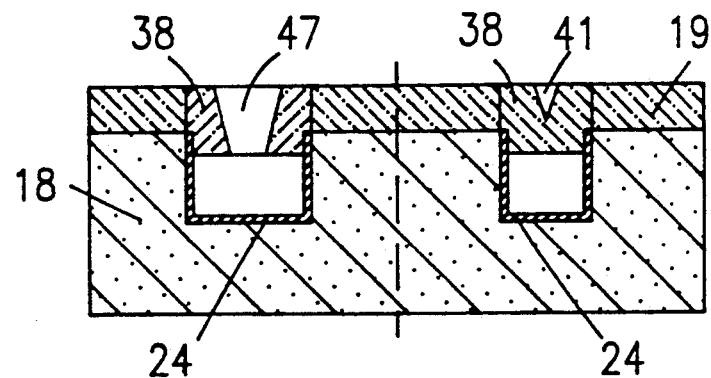

The soluble glass fill 32 in the trenches is removed by immersing the substrate in boiling water whereby the water enters the trenches through the openings 47. If desired, the water can be ultrasonically agitated. When the glass has been dissolved, the substrate is removed from the water and any water remaining in the trenches can be removed, by heating and evaporation, for example, leaving air filled trenches. FIG. 2G illustrates the process at this step.

Figure 2H:
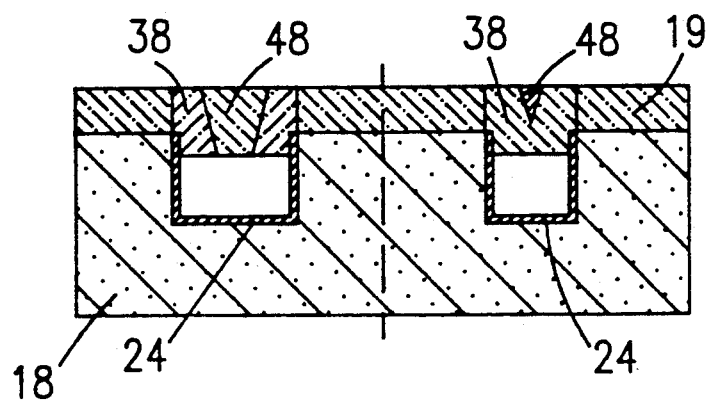

After the glass in the trenches is removed, a second non-conformal CVD silicon dioxide layer 48 is formed to fill the openings 47 and thus close them. A sample nonconformal CVD process uses silane and oxygen at a low pressure of up to atmospheric pressure, and a temperature in the range of 350-500° C. This process will tend to fill opening 48 and depression 41 with minimum deposition in trench 22, and is followed by a RIE planarization to provide the smooth upper surface shown in FIG. 2H. This step also fills the shallow recess over the trenches. Finally, the silicon dioxide cap thus formed over the air-filled trenches is planarized, preferably by a non-conformal deposition using tetroethylorthosilicate (TEOS) and oxygen in a plasma mode for the deposition and a subsequent timed RIE etch back of the CVD $SiO_2$ layer or a timed chem-mech polish for the planarization. FIG. 2H illustrates the assembly at this final process step.

Other temporary trench fill materials can be used in the practice of the invention. For example, another glass such as germanosilicate ($GeO_2$ content greater than 50%) can be used. A polymer, such as a polyimide, may be used as fill material in the trenches. The polyimide can be removed by plasma etching in $O_2$ after the CVD $SiO_2$ cap has been formed.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of fabricating an integrated circuit with air-filled isolation trenches covered by a silicon dioxide cap to seal the trenches, comprising the steps:

forming a trench in a passivated surface of a semiconductor substrate;

partially filling said trenches with a material that can be removed through a plurality of small openings in said cap;

depositing a silicon dioxide layer onto said passivated surface so that said silicon dioxide layer fills said trenches;

forming openings in said silicon dioxide layer, which openings extend to said material in said trenches;

removing said material from said trenches through said openings; and depositing silicon dioxide to fill said openings.

2. A method of fabricating an integrated circuit with air-filled isolation trenches covered by a silicon dioxide cap to seal the trenches, comprising the steps:

forming a trench in a passivated surface of a semiconductor substrate, said trench having a predetermined width and regions of increased width located periodically along said trench;

partially filling said trenches with a material that can be removed through small openings in said cap;

depositing a silicon dioxide layer onto said passivated surface by a conformal chemical vapor deposition of silicon dioxide so that said silicon dioxide layer fills said trenches and recesses form in said silicon dioxide layer at said regions of increased width;

etching said silicon dioxide layer back to said passivated surface to form openings in said silicon dioxide layer at said regions of increased width which openings extend to said material in said trenches;

removing said material from said trenches through said openings; and chemically vapor depositing silicon dioxide to fill said openings.

3. A method of fabricating an integrated circuit with air-filled isolation trenches covered by a silicon dioxide cap to seal the trenches, comprising the steps:

forming a plurality of intersecting trenches in a passivated surface of a semiconductor substrate;

partially filling said trenches with a material that can be removed through small openings in said cap;

depositing a silicon dioxide layer onto said passivated surface by a conformal chemical vapor deposition of silicon dioxide so that said silicon dioxide layer fills said trenches and recesses form in said silicon dioxide layer at trench intersections;

etching said silicon dioxide layer back to said passivated surface to form openings in said silicon dioxide layer at said trench intersections which openings extend to said material in said trenches;

removing said material from said trenches through said openings; and chemically vapor depositing silicon dioxide to fill said openings.

4. A method of fabricating an integrated circuit with air-filled isolation trenches covered by a silicon dioxide cap to seal the trenches, comprising the steps:

forming a plurality of intersecting trenches in a passivated surface of a semiconductor substrate;

partially filling said trenches with a water soluble glass that can be removed through small openings in said cap;

depositing a silicon dioxide layer onto said passivated surface by a conformal chemical vapor deposition of silicon dioxide so that said silicon dioxide layer fills said trenches and recesses form in said silicon dioxide layer at trench intersections;

etching said silicon dioxide layer back to said passivated surface to form openings in said silicon dioxide layer at said trench intersections which openings extend to said material in said trenches;

removing said water soluble glass from said trenches through said openings by immersing said substrate in water; and chemically vapor depositing silicon dioxide to fill said openings.

5. A method of fabricating an integrated circuit with air-filled isolation trenches covered by a silicon dioxide cap to seal the trenches, comprising the steps:

forming a plurality of intersecting trenches in a passivated surface of a semiconductor substrate;

partially filling said trenches with a polymer that can be removed through small openings in said cap;

depositing a silicon dioxide layer onto said passivated surface by a conformal chemical vapor deposition of silicon dioxide so that said silicon dioxide layer fills said trenches and recesses form in said silicon dioxide layer at trench intersections;

etching said silicon dioxide layer back to said passivated surface to form openings in said silicon dioxide layer at said trench intersections which openings extend to said polymer in said trenches;

removing said polymer from said trenches through said openings; and chemically vapor depositing silicon dioxide to fill said openings.

6. A method of fabricating an integrated circuit as in claim 1 further including the step of planarizing said silicon dioxide surface with said silicon dioxide filled openings to seal said cap.

7. A method of fabricating an integrated circuit as in claim 2 further including the step of planarizing said silicon dioxide surface with said silicon dioxide filled openings to seal said cap.

8. A method of fabricating an integrated circuit as in claim 3 further including the step of planarizing said silicon dioxide surface with said silicon dioxide filled openings to seal said cap.

9. A method of fabricating an integrated circuit as in claim 4 further including the step of planarizing said silicon dioxide surface with said silicon dioxide filled openings to seal said cap.

10. A method of fabricating an integrated circuit as in claim 5 further including the step of planarizing said silicon dioxide surface with said silicon dioxide filled openings to seal said cap.

11. A method of fabricating an integrated circuit as in claim 5 wherein said polymer is a polyimide.

12. A method of fabricating an integrated circuit as in claim 4 wherein said water soluble glass is a water soluble BSG glass.

13. A method of fabricating an integrated circuit as in claim 4 wherein said water soluble glass is a water soluble germanosilicate glass.

14. A method of fabricating an integrated circuit as in claim 5 wherein said step of removing said polyimide includes plasma etching said polyimide in oxygen.

15. A method of fabricating an integrated circuit as in claim 2 wherein said step of chemical vapor depositing silicon dioxide to fill said openings is a non-conformal deposition.

16. A method of fabricating an integrated circuit as in claim 3 wherein said step of chemical vapor depositing silicon dioxide to fill said openings is a non-conformal deposition.

17. A method of fabricating an integrated circuit as in claim 7 wherein said step of chemical vapor depositing silicon dioxide to fill said openings is a non-conformal deposition.

* * * * *